United States Patent
Kwong et al.

(10) Patent No.: US 6,608,258 B1
(45) Date of Patent: Aug. 19, 2003

(54) HIGH DATA RATE COAXIAL INTERCONNECT TECHNOLOGY BETWEEN PRINTED WIRING BOARDS

(75) Inventors: Herman Kwong, Kanata (CA); Richard R. Goulette, Arnprior (CA); Martin R. Handforth, Kanata (CA)

(73) Assignee: Nortel Networks Limited, Quebec (CA)

( * ) Notice: Subject to any disclaimer, the term of this patent is extended or adjusted under 35 U.S.C. 154(b) by 0 days.

(21) Appl. No.: 09/749,409

(22) Filed: Dec. 28, 2000

Related U.S. Application Data

(63) Continuation-in-part of application No. 09/660,196, filed on Sep. 12, 2000, and a continuation-in-part of application No. 09/443,128, filed on Nov. 18, 1999, application No. 09/749,409.
(60) Provisional application No. 60/246,598, filed on Nov. 8, 2000.

(51) Int. Cl.[7] .................................................. H05K 1/00
(52) U.S. Cl. ........................ 174/258; 174/266; 361/795
(58) Field of Search ................................ 174/255, 258, 174/260, 263, 264, 262; 361/780, 792, 793, 794, 795

(56) References Cited

U.S. PATENT DOCUMENTS

| | | | | | |
|---|---|---|---|---|---|
| 5,046,238 A | * | 9/1991 | Daigle et al. | ................ | 228/175 |
| 5,225,966 A | * | 7/1993 | Basavanhally et al. | ..... | 174/259 |
| 5,576,519 A | * | 11/1996 | Swamy | ........................ | 174/264 |
| 5,679,928 A | * | 10/1997 | Okano et al. | ................ | 174/257 |
| 6,163,957 A | * | 12/2000 | Jiang et al. | .................. | 174/262 |
| 6,239,496 B1 | * | 5/2001 | Asada | ......................... | 257/685 |

\* cited by examiner

Primary Examiner—Kamand Cuneo
Assistant Examiner—José H. Alcalá
(74) Attorney, Agent, or Firm—Hunton & Williams LLP

(57) ABSTRACT

A technique for electrically interconnecting a signal between a first circuit board and a second circuit board is disclosed. In each board, at least one signal conductor is shielded by an electrically conductive shield. Multiple conductors may be shielded by the same shield. A first opening is formed in the electrically conductive shield of the first circuit board and a second opening is formed in the electrically conductive shield of the second circuit board so as to expose the signal conductor in the each circuit board. An electrically conductive adhesive, reflowed solder paste, or interposer/elastomer device is applied surrounding at least one of the openings and may further be applied within at least one of the openings. The first circuit board and the second circuit board are then positioned such that the first opening and the second opening are aligned and a signal propagating along the first signal conductor is electrically interconnected to the second signal conductor.

15 Claims, 10 Drawing Sheets

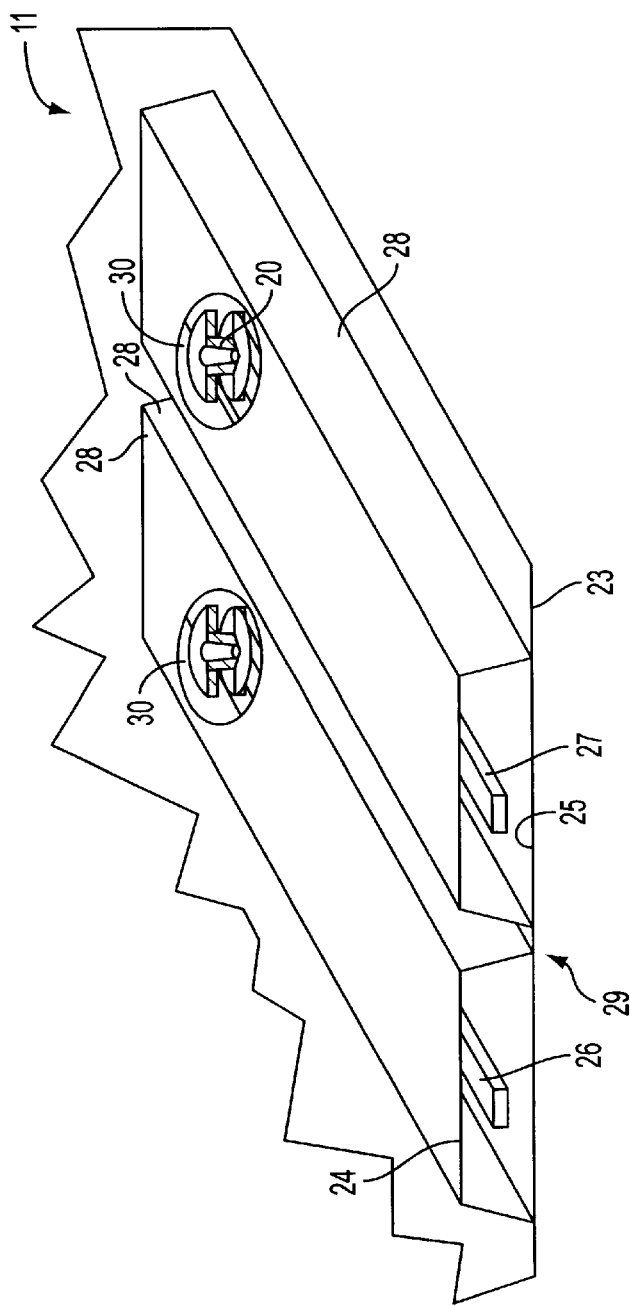
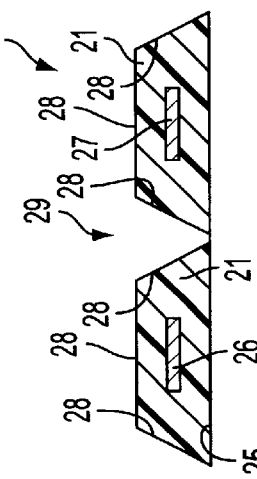
FIG. 2A (RELATED ART)
FIG. 2B (RELATED ART)

HIGH DATA RATE COAXIAL INTERCONNECT TECHNOLOGY BETWEEN PRINTED WIRING BOARDS

CROSS-REFERENCE TO RELATED APPLICATIONS

This patent application is a continuation-in-part of U.S. patent application Ser. No. 09/660,196, entitle "Technique for Coupling Signals Between Circuit Boards" which was filed on Sep. 12, 2000 as a continuation-in-part of U.S. patent application Ser. No. 09/443,128, entitled "Zero Cross-Talk Signal Line Design", filed Nov. 18, 1999, both of which are hereby incorporated by reference herein in their entirety. This application claims priority from Provisional Application Ser. No. 60/246,598, filed on Nov. 8, 2000.

FIELD OF THE INVENTION

The present invention relates generally to the making of electrical signal connections between circuit boards and, more particularly, to a technique for electrically interconnecting signals between circuit boards.

BACKGROUND OF THE INVENTION

In many computer systems, electronic components are typically mounted on a plurality of circuit boards. These circuit boards, often referred to as daughterboards, are typically mounted on a motherboard so as to allow electrical connections to be made between the electronic components mounted on the daughterboards. The mounting of the daughterboards on the motherboard is typically accomplished through conventional pin-and-box connectors. However, there are intrinsic and mechanically related parasitics associated with these conventional pin-and-box board-to-board connectors. This type of connector, due to mechanical design constraints, is inherently bandwidth limited by parasitic elements of excess capacitance and inductance. These parasitics put limits on maximum signal transmission bandwidth across the mother and daughter boards. In fact, the best connector that is presently known in the industry claims to be able to handle 5 Gb/s, which cannot meet the bandwidth demands associated with new telecommunication systems, which are on the order of 10 Gb/s.

There are also space concerns associated with the use of conventional pin-and-box board-to-board connectors. That is, conventional pin-and-box board-to-board connectors typically have bulky mechanical shrouds which take up valuable board and shelf space.

An additional problem that occurs during transmission of signals with high frequencies is cross-talk between adjacent signal conductors as further explained in U.S. patent application Ser. No. 09/443,128. This problem is particularly troublesome at high data rates such as 10 Gb/s.

In view of the foregoing, it would be desirable to provide a technique for making electrical signal connections between circuit boards which overcomes the above-described inadequacies and shortcomings. More particularly, it would be desirable to provide a technique for electrically interconnecting signals between circuit boards while eliminating problems associated with mechanical electrical connectors.

SUMMARY OF THE INVENTION

According to the present invention, a technique for electrically interconnecting a signal between a first circuit board and a second circuit board is provided. In one embodiment, the first circuit board has a first signal conductor or set of signal conductors formed therein, and the second circuit board has a second signal conductor or set of signal conductors formed therein. Also, the first signal conductor is shielded by a first electrically conductive shield, and the second signal conductor is shielded by a second electrically conductive shield. In this embodiment, the technique is realized by forming a first opening in the first electrically conductive shield so as to expose the first signal conductor in the first circuit board, and forming a second opening in the second electrically conductive shield so as to expose the second signal conductor in the second circuit board. An electrically conductive adhesive, solder paste, or interposer/elastomer device is then applied around at least one of the first and second openings and within at least one of the first and second openings. The first circuit board and the second circuit board are then positioned such that the first opening and the second opening are aligned and a signal propagating along the first signal conductor is electrically interconnected to the second signal conductor.

In accordance with still further aspects of the present invention, wherein the signal is a first signal, the first circuit board may have a third signal conductor formed therein, and the second circuit board may have a fourth signal conductor formed therein. The third signal conductor may be shielded by a third electrically conductive shield, and the second signal conductor may be shielded by a fourth electrically conductive shield. Then, a third opening may beneficially be formed in the third electrically conductive shield so as to expose the third signal conductor in the first circuit board. Also, a fourth opening may beneficially be formed in the fourth electrically conductive shield so as to expose the fourth signal conductor in the second circuit board. Further, the first circuit board and the second circuit board may beneficially be positioned such that the third opening and the fourth opening are aligned and a second signal propagating along the third signal conductor is electrically interconnected to the fourth signal conductor. Typically, the third electrically conductive shield is electrically connected to the first electrically conductive shield, and the fourth electrically conductive shield is electrically connected to the second electrically conductive shield.

In accordance with still further aspects of the present invention, the first circuit board may be a motherboard, and the second circuit board may be a daughterboard. The daughterboard is beneficially formed at least partially of flexible material so as to hollow angular mating with the motherboard.

In an alternate embodiment, the first circuit board has a first signal conductor formed therein, and the second circuit board has a second signal conductor formed therein, but only the first signal conductor is shielded by an electrically conductive shield. In this embodiment, the technique is realized by forming an opening in the electrically conductive shield so as to expose the first signal conductor in the first circuit board. The method is further realized by applying an electrically conductive adhesive, solder paste, or interposer/elastomer device surrounding the first opening and within the first opening. The first circuit board and the second circuit board are then positioned such that the first signal conductor and the second signal conductor are aligned through the opening and a signal propagating along the first signal conductor is electrically interconnected to the second signal conductor.

The present invention will now be described in more detail with reference to exemplary embodiments thereof as shown in the appended drawings. While the present invention is described below with reference to preferred embodiments, it should be understood that the present invention is not limited thereto. Those of ordinary skill in the art having access to the teachings herein will recognize additional implementations, modifications, and embodiments, as well as other fields of use, which are within the scope of the present invention as disclosed and claimed herein, and with respect to which the present invention could be of significant utility.

BRIEF DESCRIPTION OF THE DRAWINGS

In order to facilitate a fuller understanding of the present invention, reference is now made to the appended drawings. These drawings should not be construed as limiting the present invention, but are intended to be exemplary only.

FIG. 2A illustrates a fragmentary perspective view of a printed wiring board incorporating the invention for the case of single-ended interconnects.

FIG. 2B is a cross-sectional view of FIG. 2A illustrating typical construction.

DETAILED DESCRIPTION OF EXEMPLARY EMBODIMENT(S)

In order to facilitate a fuller understanding of the present invention, reference is now made to the appended drawings. These drawings should not be construed as limiting the present invention, but are intended to be exemplary only.

Figure 1A:
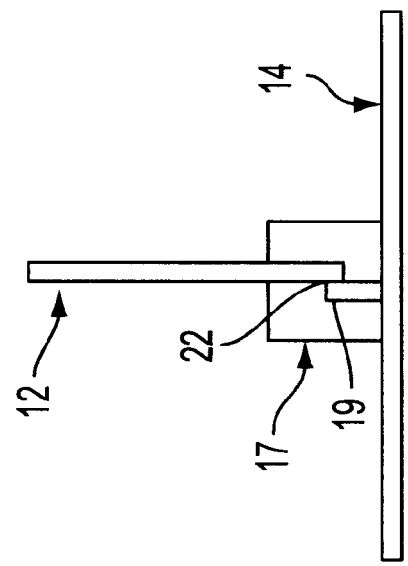
FIG. 1A is a side cross-sectional view of a portion of the conventional motherboard/daughterboard mounting configuration shown in FIG. 1.
Figure 1:
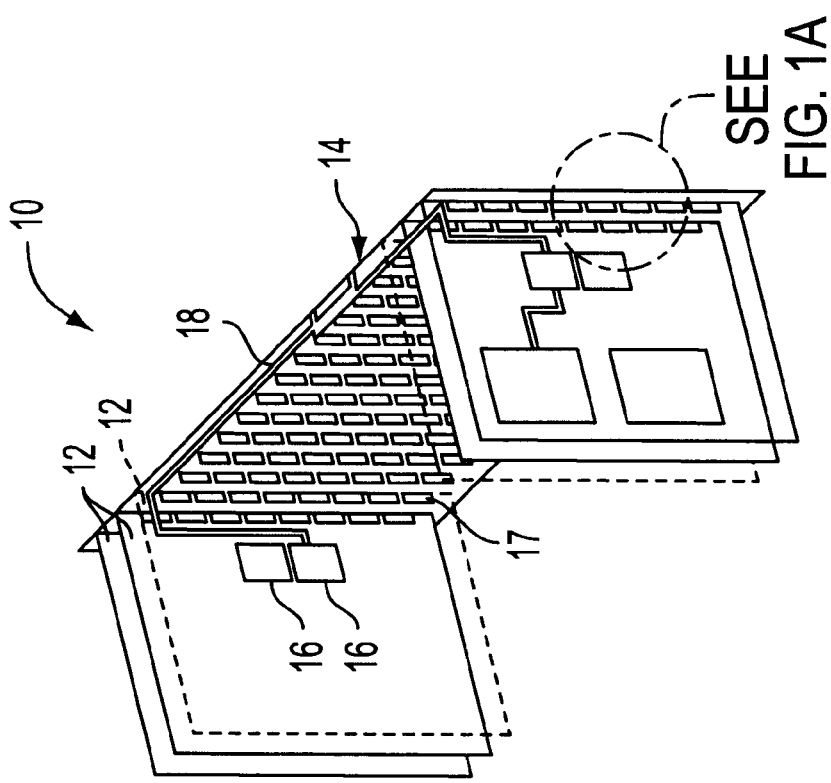
FIG. 1 is a perspective view of a conventional motherboard/daughterboard mounting configuration.

To illustrate the concept of the present invention it is first useful to show a conventional motherboard/daughterboard mounting configuration. Referring to FIG. 1, there is shown such a conventional motherboard/daughterboard mounting configuration 10, wherein a plurality of daughterboards 12 are shown mounted to a single motherboard 14. Each daughterboard 12 has electronic components 16 mounted thereon which are electrically connected to each other by signal conductors 18 in both the daughterboards 12 and the motherboard 14. The signal conductors 18 in the daughterboards 12 and the motherboard 14 are electrically connected via pin-and-box connectors 17. That is, electrically conductive contact pads 22 on the daughterboards 12 are placed into electrical contact with electrically conductive pins 19 within the pin-and-box connectors 17 (see FIG. 1a). The electrically conductive pins 19 are electrically connected to electrically conductive contact pads or vias (not shown) on the motherboard 14. The electrically conductive contact pads 22 on the daughterboards 12 and the electrically conductive contact pads or vias on the motherboard 14 are in electrical connection with the signal conductors 18 in the daughterboards 12 and the motherboard 14, respectively. The pin-and-box connectors 17 are typically constructed such that the daughterboards 12 are oriented at 90° with respect to the motherboard 14.

Referring to FIGS. 2A and 2B, a printed wiring board (PWB) includes a dielectric material 21 with a copper ground plane 25 coating a lower surface 23 of the PWB 11. In this embedded microstrip configuration, single-ended copper conductors 26 and 27, are embedded in a plane in the dielectric material 21 and extend parallel to each other and to an upper 24 and a lower 23 surface of the PWB. A V-shaped groove 29, running parallel to the copper conductors 26, 27, is provided on both sides of each conductor 26, 27 and extends from the upper surface 24 all the way to the lower ground plane 25. Only one complete groove 29 is illustrated, namely the one between conductors 26 and 27. The grooves 29 extend along the entire length of the copper conductors and are located equidistantly between the individual traces. The upper surface 24 of the PWB 11 is provided with a copper coating 28 which extends along the surfaces of the grooves 29 and into contact with the ground plane 25. Together with the ground plane 25, the copper coating 28 forms a complete shield around each signal conductor 26, 27. Via-in-pads 20 for connecting the conductors 26, 27 are also shown for completeness.

These continuous electrically conductive shields described above are beneficial for reducing or eliminating cross-talk between signals propagating along adjacent signal conductors 26 and 27. These structures are also described in related U.S. patent application Ser. No. 09/443,128, filed Nov. 18, 1999, which is incorporated by reference herein in its entirety.

Thus, each signal conductor 26, 27 is enclosed by a continuous electrically conductive shield 28, except where openings 30 are formed in the top ground plane layer 24.

Figure 3A:
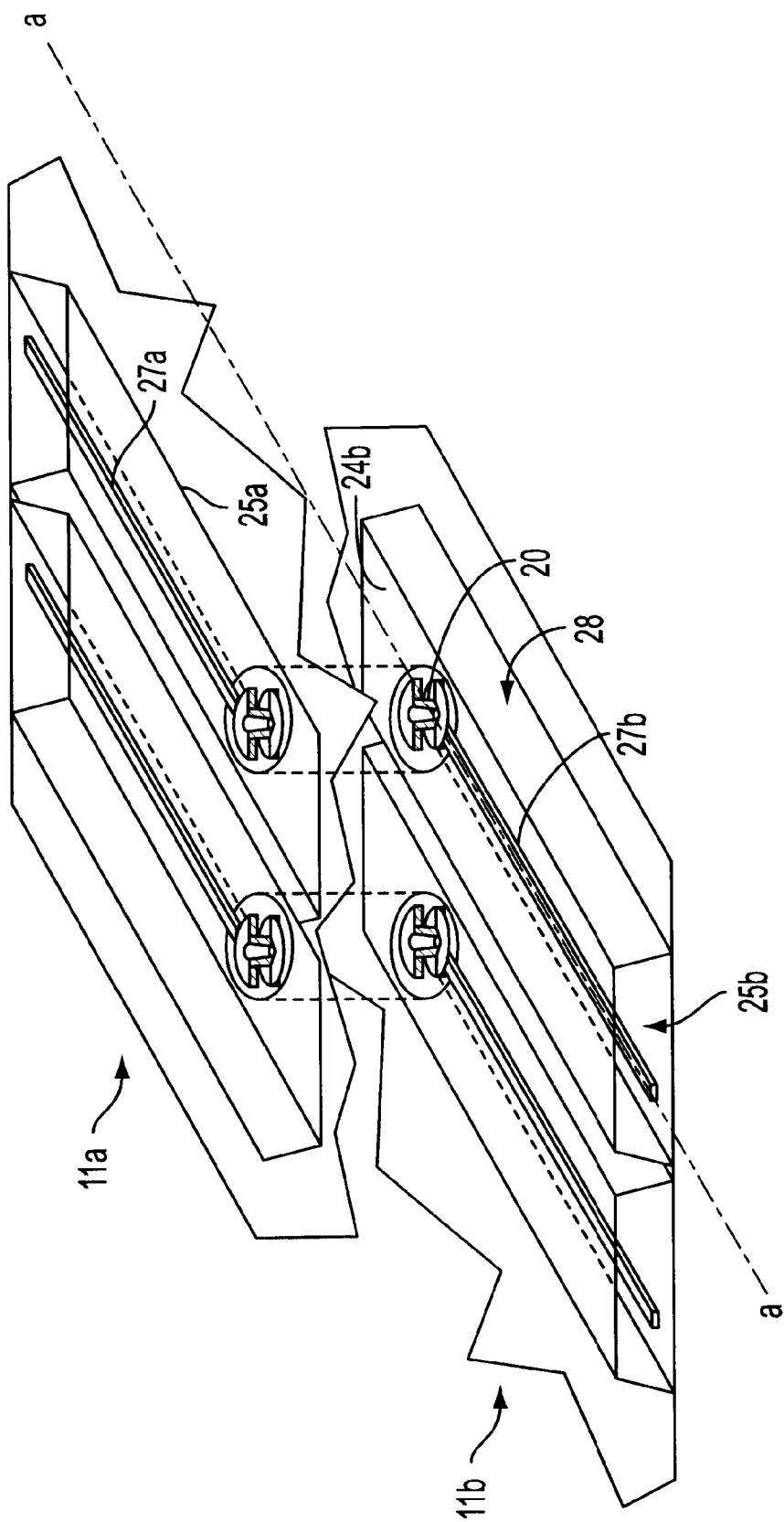
FIG. 3A is a perspective view illustrating an interconnect between two signal ended boards.
Figure 3B:
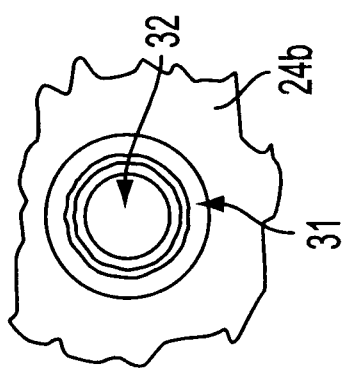
FIG. 3B is a top view of an interconnect for the configuration of FIG. 3A.
Figure 3C:
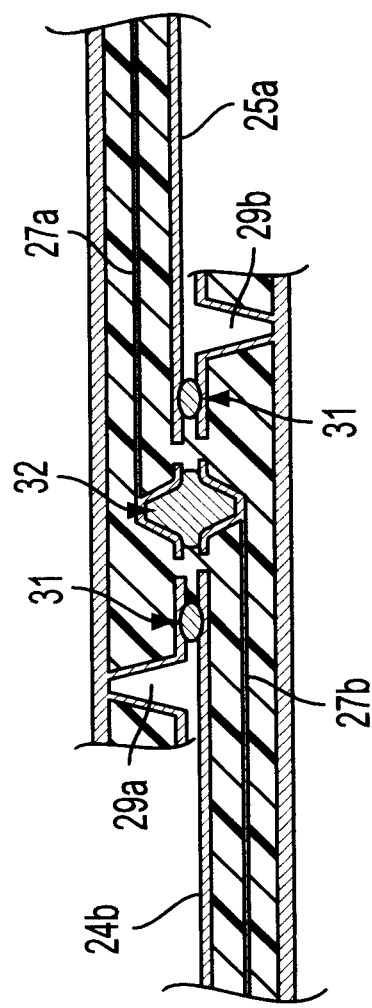
FIG. 3C is a detailed cross-section along line a—a of FIG. 3A.

FIGS. 3A, 3B, and 3C illustrate a technique for connecting two PWBs 11 of the type shown in FIGS. 2A and 2B. The interconnect terminals/pads of PWB 11a and PWB 11b are mated together directly without a connector. FIG. 3A is a perspective view showing the interconnection between the two PWBs 11a and 11b. FIG. 3B is a top view of an interconnect of the invention and FIG. 3C is a detailed cross section at interface a—a of FIG. 3A. As most clearly shown in FIGS. 3A and 3B, an electrically conductive adhesive, solder paste, or interposer/elastomer device 31, 32 is used to connect a bottom ground plane 25a of PWB 11a to a top ground plane 24b of PWB 11b.

In one embodiment, solder paste or conductive adhesive 32 is preferably applied to fill the via-in-pads 20 of each PWB 11a, 11b. Additional solder paste or conductive adhesive 31 is applied around the via-in-pad, preferably in a circular configuration as shown in FIG. 3B. The solder paste or conductive adhesive is preferably reflowed onto the ground planes 25a and 24b of each PWB 11a and 11b. The solder paste or electrically conductive adhesive 31, 32 forms a "donut" shape as is clearly illustrated in FIG. 3B.

The conductive adhesive may comprise any type known in the art, and in particular may comprise silver or copper loaded polymer thick films (also known as conductive adhesives). The solder paste additionally may comprise any type of solder paste known in the art. Both the adhesives and the solder pastes are good conductors. The conductive adhesives cure at lower temperatures and are easier to rework. However, when conductive adhesives are used, the contact resistance increases over time and impacts electrical performance of the circuit. Accordingly, the use of conductive adhesive or solder paste is a design choice, which depends upon the ultimate product goals.

A variety of techniques may be used for applying the solder paste to the ground planes, including, but not limited to (1) screen printing and (2) using a automatic dispensing machine. Screen printing is accomplished through the use of a stencil or screen through which adhesive or paste is applied to the terminal pads of the conductors. The volume of the paste or adhesive is determined by the mesh size of the stencil or screen. When a dispensing machine is used, the paste or adhesive is dispensed through a nozzle in the form of dots or a continuous line. The volume of the paste or adhesive is determined by the size of the nozzle, the number of dots dispensed, and the rheology of the dispensed compound.

When the interposer/elastomer device, such as a gasket for example, is used rather than solder paste or conductive adhesive, the interposer/elastomer device may also be positioned in the donut configuration 31, 32 as shown in FIGS. 3A and 3B or alternatively may be merely circular in shape. Therefore, the interposer/elastomer device has multiple points of contact with the conductors and electrically connects them.

The technique described in prior art U.S. Pat. No. 5,101,553 can be applied well in this application. The patent discloses a method of making a metal-on-elastomer pressure contact connector. The method comprises embedding a plurality of parallel co-planar copper-beryllia wires comprising a plurality of coils in a silicone rubber elastomer with top and bottom surfaces, and removing metal from the tops and bottoms of coils to form a pair of isolated wire filaments from each coil which extend from top surface to the bottom surface of the elastomer. The filaments form arrays of electrical contacts above and below the elastomer exceeding 10,000 contacts per square inch.

However, the interposer/elastomer device does not secure the boards mechanically unless solder paste, mechanical clamps, or some other type of securing device is additionally used.

Figure 4A:
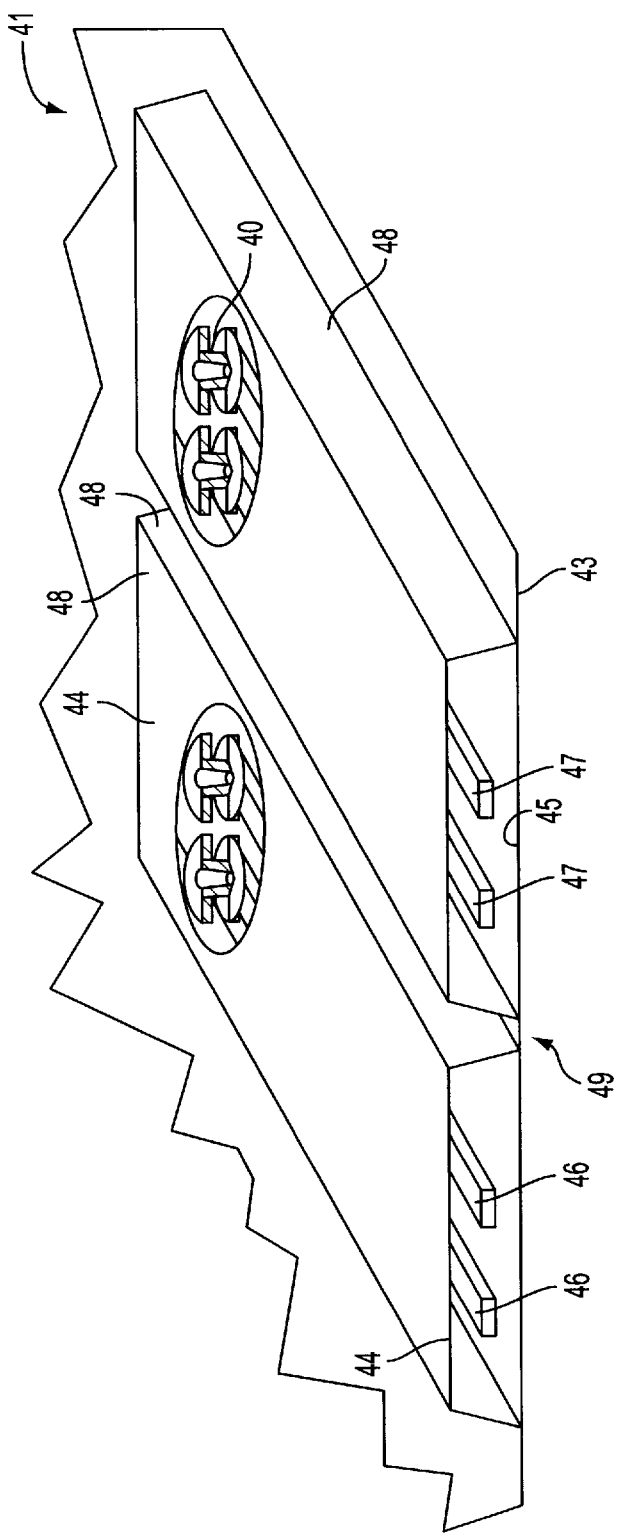
FIG. 4A is a perspective view of a board having a differential pair configuration.
Figure 4B:
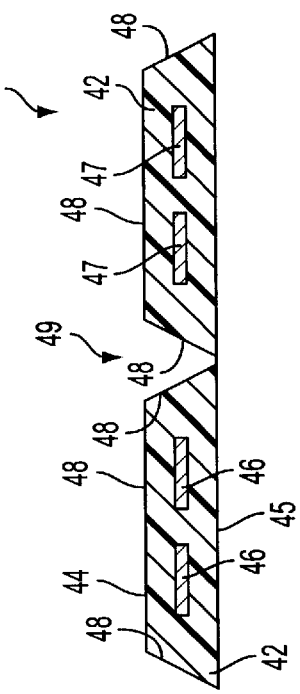
FIG. 4B is a cross-sectional view of the board of FIG. 4A.

FIGS. 4A and 4B illustrate the case of differential pairs of copper signal conductors 46, 47. The board 41 is comprised of a dielectric material 42 with a conductive ground plane 45 on its lower surface. The implementation is identical to that of FIGS. 2A and 2B except that a groove 49 is now formed between each differential pair of copper signal conductors 46, 47. Plated copper shields 48 surround each differential pair, and together with the ground plane 45, form a complete shield around each differential pair of signal lines. In addition to the edge coupled representation depicted in FIGS. 4A and 4B, the invention may similarly be implemented with differential line pairs that are broadside coupled.

Figure 5A:
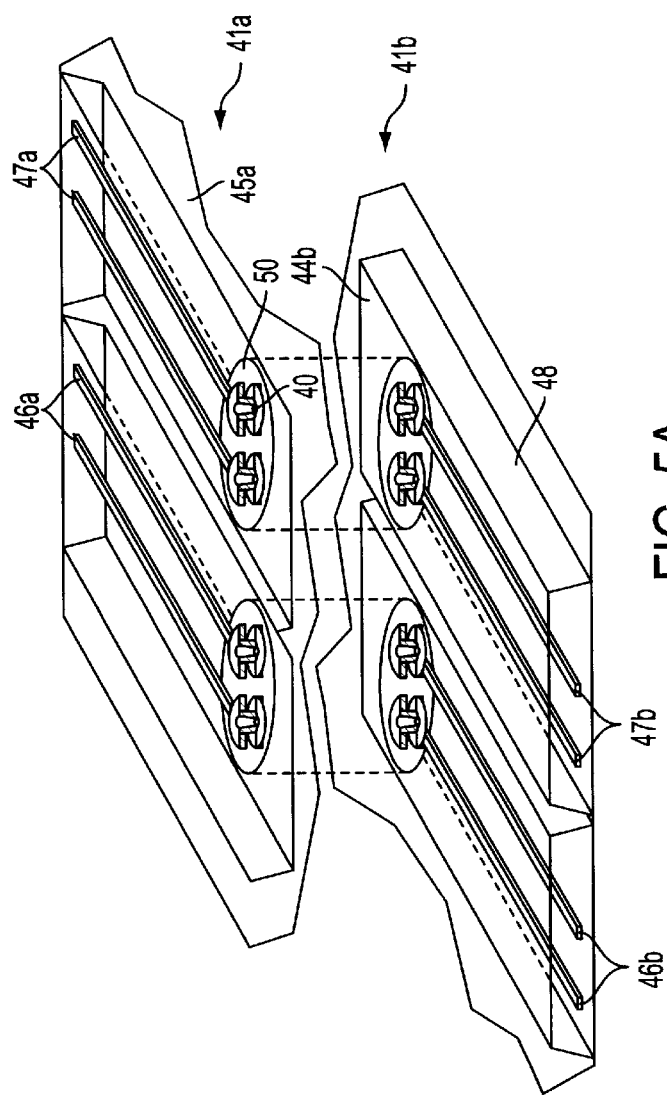
FIG. 5A is a perspective view of an interconnect between the boards of FIG. 4A.
Figure 5B:
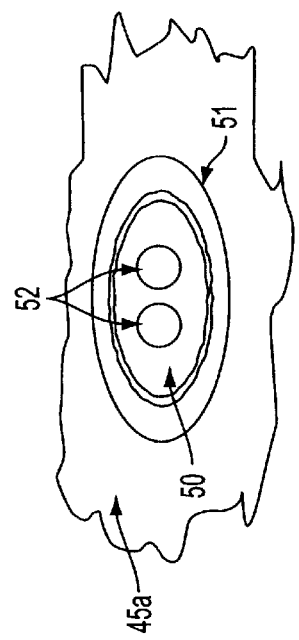
FIG. 5B is a top view of the interconnect of an embodiment of the invention for the board of FIG. 5A.

FIGS. 5A and 5B illustrate the electrical interconnection of two PWBs 41a and 41b of the type illustrated in FIGS. 4A and 4B. A solder paste, conductive adhesive, or interposer/elastomer device 51, 52 is applied onto at least one of the ground planes 45a and 44b of the PWBs 41a and 41b. With the paste or adhesive, the ground planes 45a and 44b are mated together forming a hermetic conductive shield. As shown, a ring of solder paste or conductive adhesive 51 is applied around the openings 50 of both PWBs 41a and 41b. Additional solder paste or conductive adhesive 52 is applied to fill the via-in-pads 40 of the respective PWBs 41a and 41b. The use of an interposer/elastomer device is similar to that described above in connection with FIGS. 3A and 3B.

Figure 6:
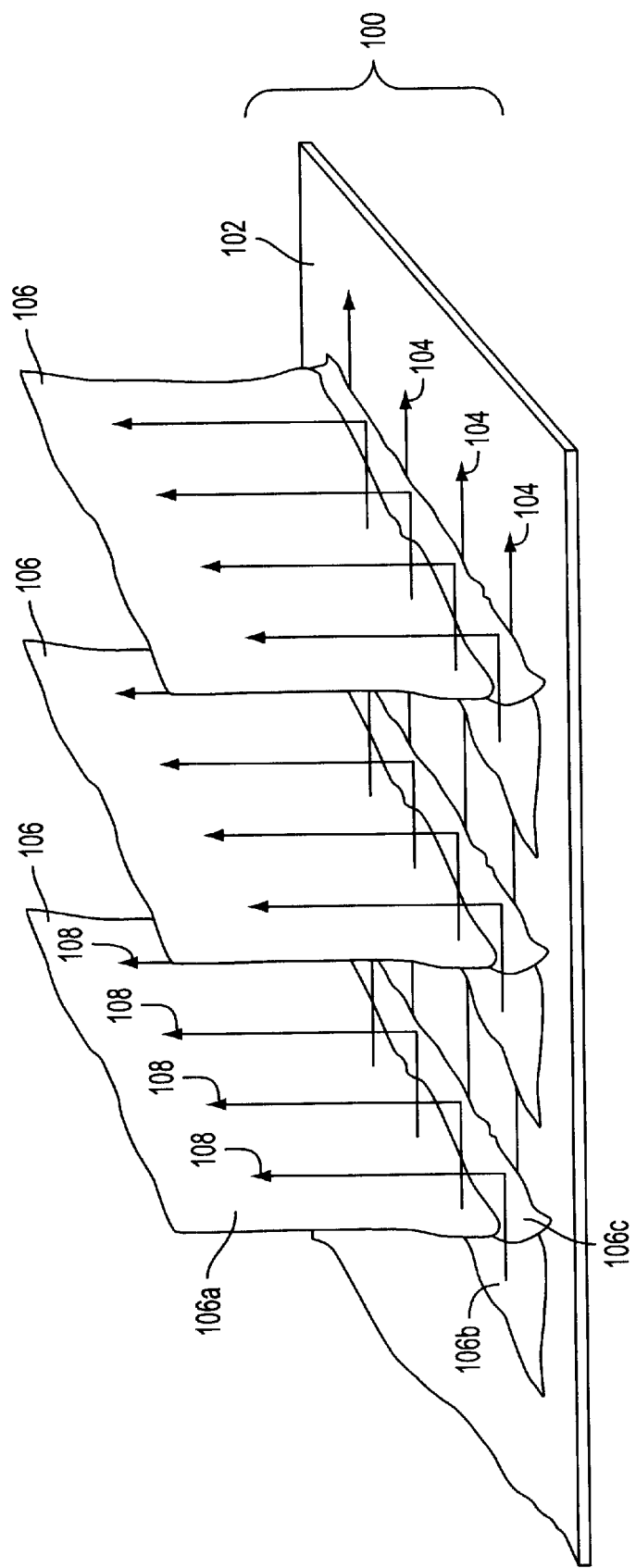
FIG. 6 is a perspective view of an embodiment of a motherboard/daughterboard interface configuration in accordance with the present invention.

Referring to FIG. 6, there is shown an embodiment of a motherboard/daughterboard interface configuration 100 in accordance with the present invention wherein a plurality of daughterboards 106 are shown interfacing with a single-sided motherboard 102. All of the daughterboards 106 interface with the single-sided motherboard 102 in accordance with the present invention in the manner described herein.

The motherboard/daughterboard interface configuration 100 comprises a motherboard 102 having a plurality of signal conductors 104 formed therein. The interface configuration 100 also comprises a daughterboard 106 also having a plurality of signal conductors 108 formed therein. The daughterboard 106 has an upper rigid portion 106a and a lower rigid portion 106b connected by a middle flexible portion 106c. The signal conductors 108 are formed in and pass through all of these portions 106a, 106b, and 106c, as shown. The middle flexible portion 106c allows the upper rigid portion 106a to be substantially perpendicular to the motherboard 102 (as in conventional motherboard/daughterboard mounting configurations), while allowing the lower rigid portion 106b to be substantially parallel to the motherboard 102. It should be noted that the present invention is not limited in the regard. For example, the daughterboard 106 could be entirely flexible or entirely rigid.

Figure 6A:
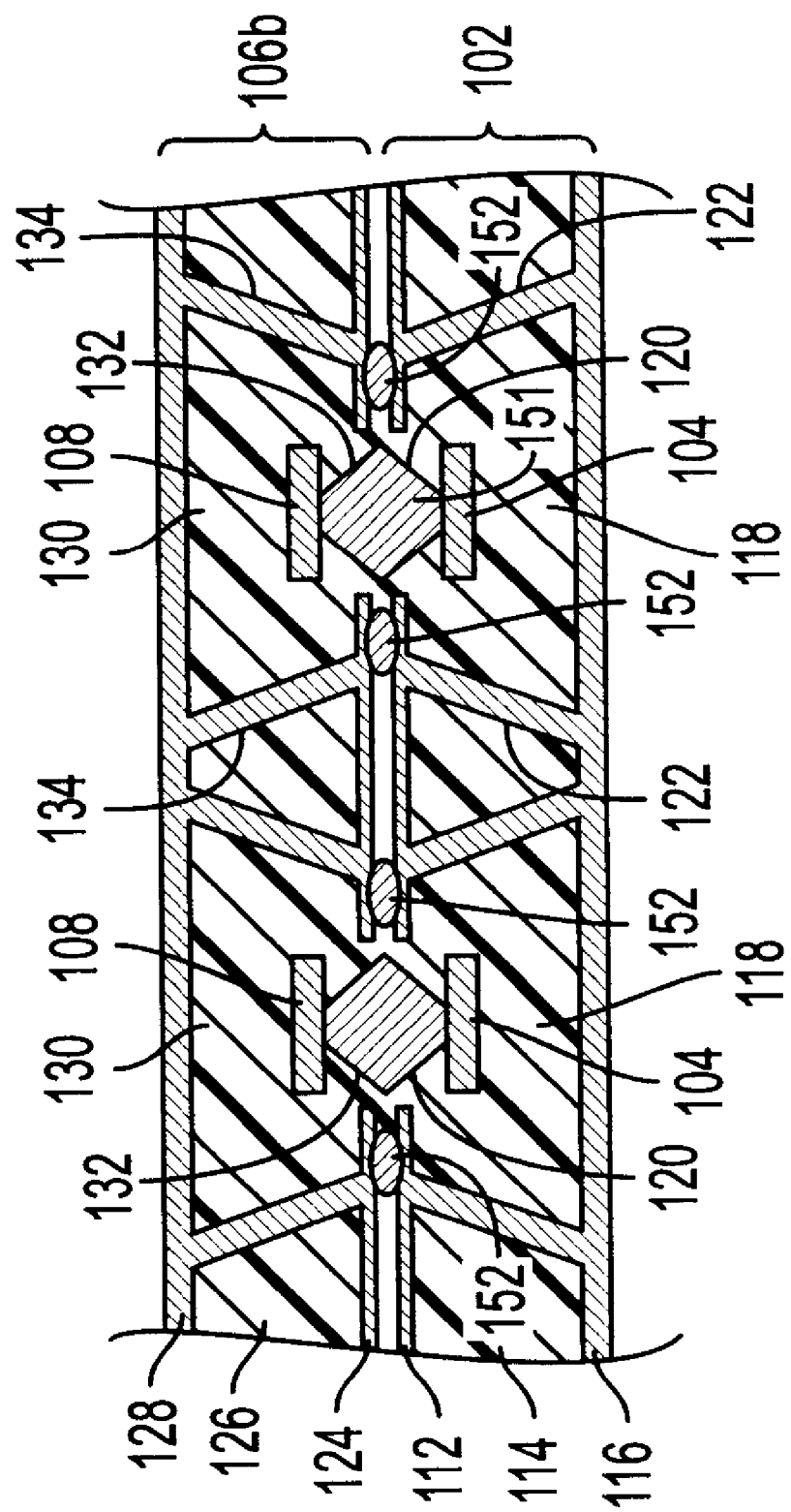
FIG. 6A is a cross-sectional view of the configuration of FIG. 6.

Referring to FIG. 6A, only the top layers of the motherboard 102 and the bottom layers of the lower rigid portion 106b of the daughterboard 106 are shown. The motherboard 102 comprises a top electrically conductive ground plane layer 112, a signal layer 114, and a buried electrically conductive ground plane layer 116. The signal layer 114 has the signal conductors 104 formed therein. The signal conductors 104 are surrounded by a dielectric material 118. The top ground plane layer 112 has openings 120 formed therein so as to expose at least a portion of the signal conductors 104 in accordance with the present invention. Connecting the top ground plane layer 112 and the buried ground plane layer 116 are a plurality of electrically conductive groove walls 122 which extend along the entire length of the signal conductors 104 within the motherboard 102. Thus, each signal conductor 104 is enclosed by a continuous electrically conductive shield, as described above with reference to FIGS. 2–5, except where the openings 120 are formed in the top ground plane layer 112.

The lower rigid portion 106b of the daughterboard 106 comprises a bottom electrically conductive ground plane layer 124, a signal layer 126, and a buried electrically conductive ground plane layer 128. The signal layer 126 has the signal conductors 108 formed therein. The signal conductors 108 are surrounded by a dielectric material 130. The bottom ground plane layer 124 has openings 132 formed therein so as to expose at least a portion of the signal conductors 108 in accordance with the present invention. Connecting the bottom ground plane layer 124 and the buried ground plane layer 128 are a plurality of electrically conductive groove walls 134 which extend along the entire length of the signal conductors 108 within the lower rigid portion 106b of the daughterboard 106. Thus, each signal conductor 108 is enclosed by a continuous electrically conductive shield, except where the openings 132 are formed in the bottom ground plane layer 124.

An electrically conductive paste or reflowed solder 151 may be applied in the vias between the openings 120 and 132 and the signal conductors 104 and 108 respectively. An electrically conductive paste or reflowed solder 152 may befurther applied surrounding the openings 120 and 132. The paste or solder 152 is preferably applied on one or both boards in a circular pattern. Alternatively, an interposer/elastomer device may be used as described above. The openings 120 formed in the top ground plane layer 112 of the motherboard 102 and the openings 132 formed in the bottom ground plane layer 124 of the lower rigid portion 106b of the daughterboard 106 as well as the contact pads within the openings are aligned.

Figure 7:
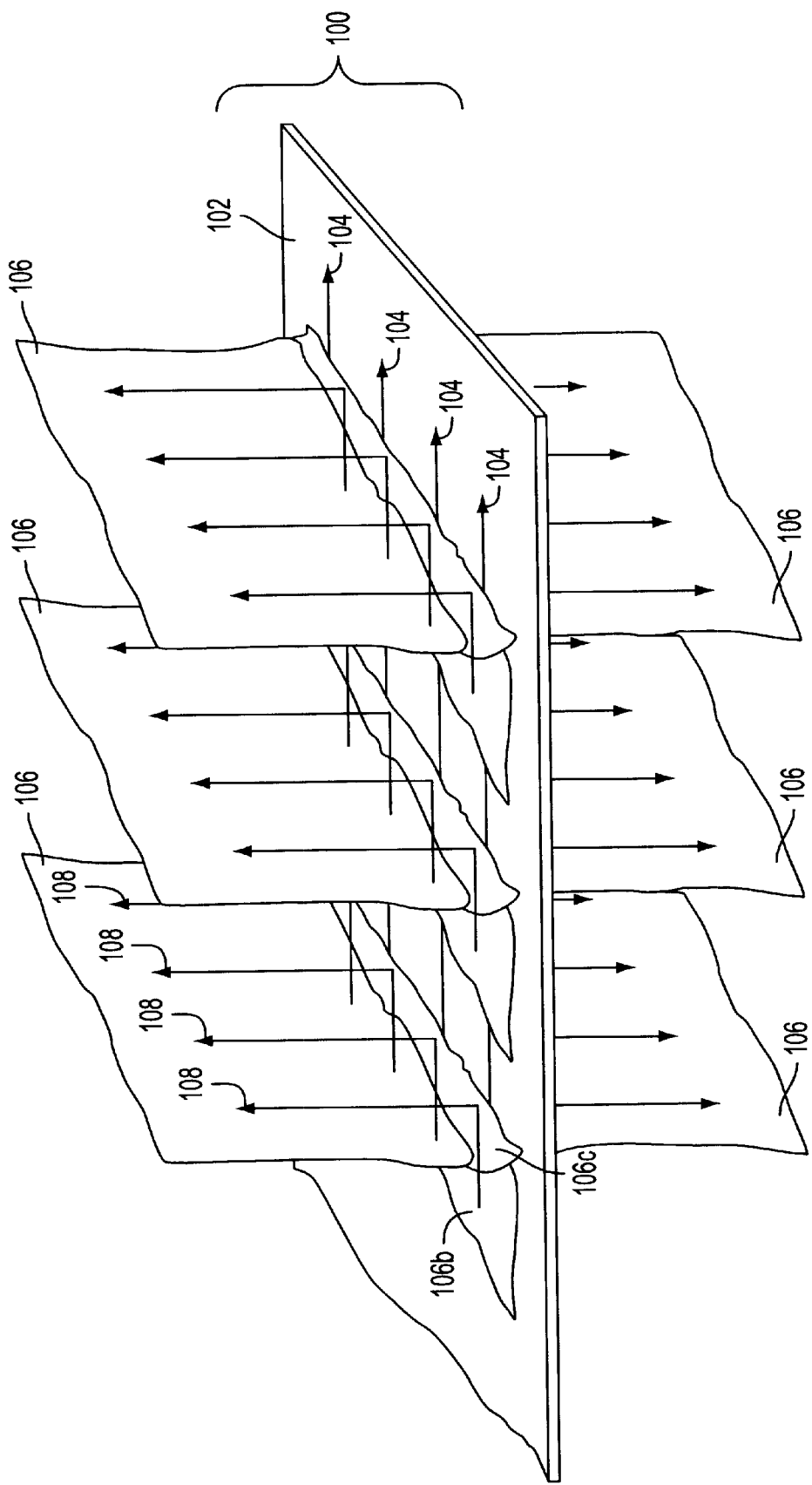
FIG. 7 is a perspective view of an additional embodiment of a motherboard/daughterboard interface configuration in accordance with the present invention.

Referring to FIG. 7, there is shown an additional embodiment of a motherboard/daughterboard interface configuration 100 in accordance with the present invention wherein a plurality of daughterboards 106 are shown interfacing with a double-sided motherboard 102. All of the daughterboards 106 interface with the double-sided motherboard 102 in accordance with the present invention in the manner described above.

At this point it should be noted that in all of the above-described embodiments only one of the signal conductors or neither of the conductors may have a shield with an opening and the circuit boards may be positioned such that the signal conductors are aligned through the opening and a signal propagating along a first signal conductor in a first circuit board is electrically connected to a second signal conductor in a second circuit board. If neither of the conductors is shielded, some benefits are sacrificed, but the benefits derived from the absence of mechanical connectors are retained.

Figure 8:
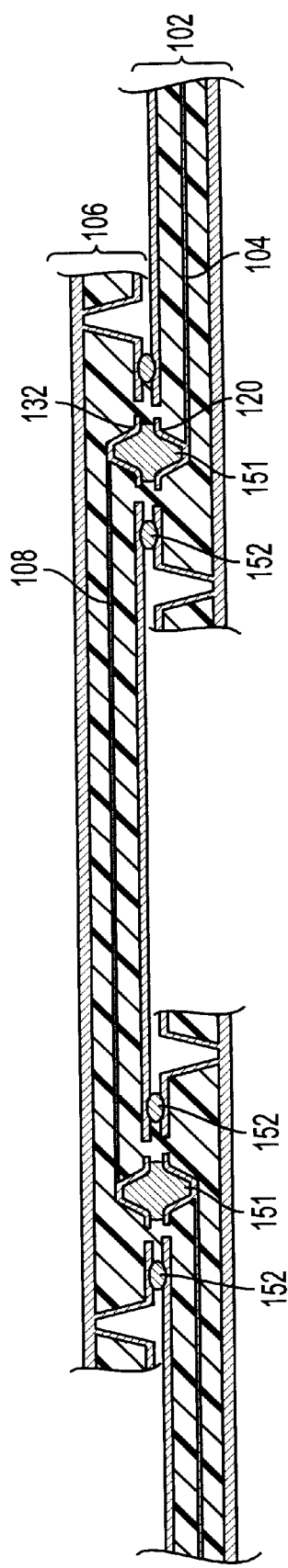
FIG. 8 is a cross-sectional view of an alternative embodiment of the invention.

FIG. 8 illustrates a cross-section of two PWB's 102 and 106 which have a horizontal interconnection. This embodiment includes like reference numerals to the embodiments shown in FIGS. 6 and 7.

In view of the foregoing, it is apparent that the present invention provides a technique for electrically interconnecting signals between circuit boards wherein the need for conventional mechanical connectors is totally eliminated. The elimination of conventional mechanical connectors results in the elimination of parasitics that are typically associated with conventional mechanical connectors, thereby resulting in better signal integrity. Also, there are no longer any costs for purchasing connectors, as well as no assembly costs for mounting the connectors on a motherboard. Further, by incorporating the shielding concept described in related U.S. patent application Ser. No. 09/443, 128, filed Nov. 8, 1999, which is incorporated by reference herein in its entirety, there is minimal or no unwanted signal cross-talk. Thus, the present invention is particularly beneficial for high data rate applications.

The present invention is not to be limited in scope by the specific embodiments described herein. Indeed, various modifications of the present invention, in addition to those described herein will be apparent to those of ordinary skill in the art from the foregoing description and accompanying drawings. Thus, such modifications are intended to fall within the scope of the following appended claims. Further, although the present invention has been described herein in the context of a particular implementation in a particular environment for a particular purpose, those of ordinary skill in the art will recognize that its usefulness is not limited thereto and that the present invention can be beneficially implemented in any number of environments for any number of purposes. Accordingly, the claims set forth below should be construed in view of the full breadth and spirit of the present invention as disclosed herein.

What is claimed is:

1. A system for electrically interconnecting circuit boards, the system comprising:
   a first circuit board having a first signal conducting means formed therein, the first signal conducting means being shielded by a first electrically conductive shield, the first electrically conductive shield having a first opening formed therein so as to expose the first signal conducting means in the first circuit board;
   a second circuit board having a second signal conducting means formed therein, the second signal conducting means being shielded by a second electrically conductive shield, the second electrically conductive shield having a second opening formed therein so as to expose the second signal conducting means in the second circuit board; and
   an electrically conductive material surrounding at least one of the first and second openings and within at least one of the first and second openings;
   wherein the first circuit board and the second circuit board are electrically interconnected by the electrically conductive material such that the first opening and the second opening are aligned and the first signal conducting means is electrically interconnected to the second signal conducting means.

2. The system as defined in claim 1, wherein the electrically conductive material comprises an electrically conductive adhesive, solder paste, or interposer/elastomer device disposed within a first via located within the first opening and within a second via located within the second opening.

3. The system as defined in claim 1, wherein the first signal conducting means comprises a pair of signal conductors and the second signal conducting means comprises a pair of signal conductors.

4. The system as defined in claim 1, wherein the first signal conducting means and the second signal conducting means each comprise a single conductor.

5. The system as defined in claim 1, wherein the first circuit board and the second circuit board are multilayer circuit boards, wherein the first electrically conductive shield and the second electrically conductive shield are respective electrically conductive layers of the first circuit board and the second circuit board.

6. The system as defined in claim 1, wherein the first electrically conductive shield and the second electrically conductive shield are formed by respective ground plane layers of the first circuit board and the second circuit board.

7. The system as defined in claim 6, wherein the first signal conducting means and the second signal conducting means are formed on respective signal layers of the first circuit board and the second circuit board, wherein the signal layers are disposed beneath the ground plane layers in the first circuit board and the second circuit board.

8. The system as defined in claim 1, wherein a high speed signal carrying data at a rate on the order of 1 Gb/s and above propagates from the first signal conducting means to the second signal conducting means via the electrically conductive material.

9. The system as defined in claim 1,
   wherein the first circuit board has a third signal conducting means formed therein, wherein the third signal conducting means is shielded by a third electrically conductive shield, wherein a third opening is formed in the third electrically conductive shield so as to expose the third signal conducting means in the first circuit board;

wherein the second circuit board has a fourth signal conducting means formed therein, wherein the fourth signal conducting means is shielded by a fourth electrically conductive shield, wherein a fourth opening is formed in the fourth electrically conductive shield so as to expose the fourth signal conducting means in the second circuit board;

wherein an electrically conductive material is applied around at least one of the third and fourth openings and within at least one of the third and fourth openings; and wherein the first circuit board and the second circuit board are positioned such that the third opening and the fourth opening are aligned and the third signal conducting means is electrically connected to the fourth signal conducting means.

10. The system as defined in claim 9, wherein the third electrically conductive shield is electrically connected to the first electrically conductive shield, wherein the fourth electrically conductive shield is electrically connected to the second electrically conductive shield.

11. The system as defined in claim 1, wherein the first circuit board is a motherboard, wherein the second circuit board is a daughterboard.

12. The system as defined in claim 11, wherein the daughterboard is formed at least partially of flexible material so as to allow angular mating with the motherboard.

13. A system for electrically interconnecting circuit boards, the system comprising:

a first circuit board having a first signal conducting means formed therein, the first signal conducting means being shielded by a first electrically conductive shield, the first electrically conductive shield having a first opening formed therein so as to expose the first signal conducting means in the first circuit board; and a second circuit board having a second signal conducting means formed therein; and an electrically conductive material surrounding the first opening and applied within the first opening, wherein the first circuit board and the second circuit board are positioned such that the first signal conducting means and the second signal conducting means are aligned through the opening and the first signal conducting means is electrically interconnected to the second signal conducting means.

14. The system as defined in claim 13, wherein the first signal conducting means comprises a first pair of conductors and the second signal conducting means comprises a second pair of conductors and each conductor of the first pair is connected with a conductor of the second pair for transmission of two signals between the first pair and the second pair.

15. The system as defined in claim 13, wherein the first signal conducting means comprises a single conductor and the second signal conducting means comprises a single conductor.

* * * * *